US00RE40630E

(19) United States
(12) Reissued Patent
McEwan et al.

(10) Patent Number: US RE40,630 E
(45) Date of Reissued Patent: Jan. 27, 2009

(54) LOW PROFILE COMPUTER CASE AND COMPUTER

(75) Inventors: John A. McEwan, Alexandria, VA (US); James Stewart McEwan, Great Falls, VA (US)

(73) Assignee: Technology Advancement Group, Inc., Dulles, VA (US)

(21) Appl. No.: 10/283,112

(22) Filed: Oct. 30, 2002

Related U.S. Patent Documents

Reissue of:
(64) Patent No.: 6,315,655
Issued: Nov. 13, 2001
Appl. No.: 09/516,706
Filed: Mar. 1, 2000

(51) Int. Cl.
*H05K 7/20* (2006.01)

(52) U.S. Cl. ..... 454/184; 361/695
(58) Field of Classification Search ..... 454/184; 361/694, 695
See application file for complete search history.

(56) References Cited

U.S. PATENT DOCUMENTS 2,166,798 A * 7/1939 Cote ..... 264/248
3,930,818 A * 1/1976 McDougall ..... 55/414
4,084,250 A * 4/1978 Albertine et al. ..... 361/687
4,672,509 A * 6/1987 Speraw ..... 361/687
4,868,362 A * 9/1989 Takeuji ..... 219/757
4,926,291 A * 5/1990 Sarraf ..... 361/685
5,089,667 A * 2/1992 Goussin et al. ..... 174/101
5,121,296 A * 6/1992 Hsu ..... 361/685
5,136,465 A * 8/1992 Benck et al. ..... 361/687
5,168,424 A * 12/1992 Bolton et al. ..... 361/695
5,193,050 A * 3/1993 Dimmick et al. ..... 361/694
5,280,138 A * 1/1994 Preston et al. ..... 174/152 G
5,331,506 A * 7/1994 Nakajima ..... 361/683
5,369,549 A * 11/1994 Kopp et al. ..... 361/679
5,398,161 A * 3/1995 Roy ..... 361/727
5,442,513 A * 8/1995 Lo ..... 361/685
5,469,893 A * 11/1995 Caveney et al. ..... 138/162
5,546,272 A * 8/1996 Moss et al. ..... 361/687
5,570,270 A * 10/1996 Naedel et al. ..... 361/687
5,694,294 A * 12/1997 Ohashi et al. ..... 361/687
5,704,212 A * 1/1998 Erler et al. ..... 62/3.2
5,731,951 A * 3/1998 Michaud et al. ..... 361/685
5,764,481 A * 6/1998 Ruch et al. ..... 361/685
5,793,610 A * 8/1998 Schmitt et al. ..... 361/695
5,800,258 A * 9/1998 Knoop et al. ..... 454/184
5,823,644 A * 10/1998 Suh et al. ..... 312/223.2
5,825,615 A * 10/1998 Ohara ..... 361/683
5,829,515 A * 11/1998 Jeffries et al. ..... 165/80.3
5,831,525 A * 11/1998 Harvey ..... 340/507
5,835,346 A * 11/1998 Albani et al. ..... 361/684
5,871,264 A * 2/1999 Ohara ..... 312/334.7

FOREIGN PATENT DOCUMENTS

GB 2234012 A * 1/1991

OTHER PUBLICATIONS

EIA Standard, "Racks, Panels and Associated Equipment", Electronic Industries Association, Nov. 1977.*

* cited by examiner

*Primary Examiner*—Gregory A Wilson
(74) *Attorney, Agent, or Firm*—Nixon Peabody LLP; Marc W. Butler

(57) ABSTRACT

A low profile computer case having two centrifugal blowers mounted in a partition therein. An intake port of a first blower faces a bottom panel of the case and an intake port of the second blower faces a top panel of the case. Standoff dimensions are defined between the respective intake ports and panels to permit operation of the blowers.

45 Claims, 6 Drawing Sheets

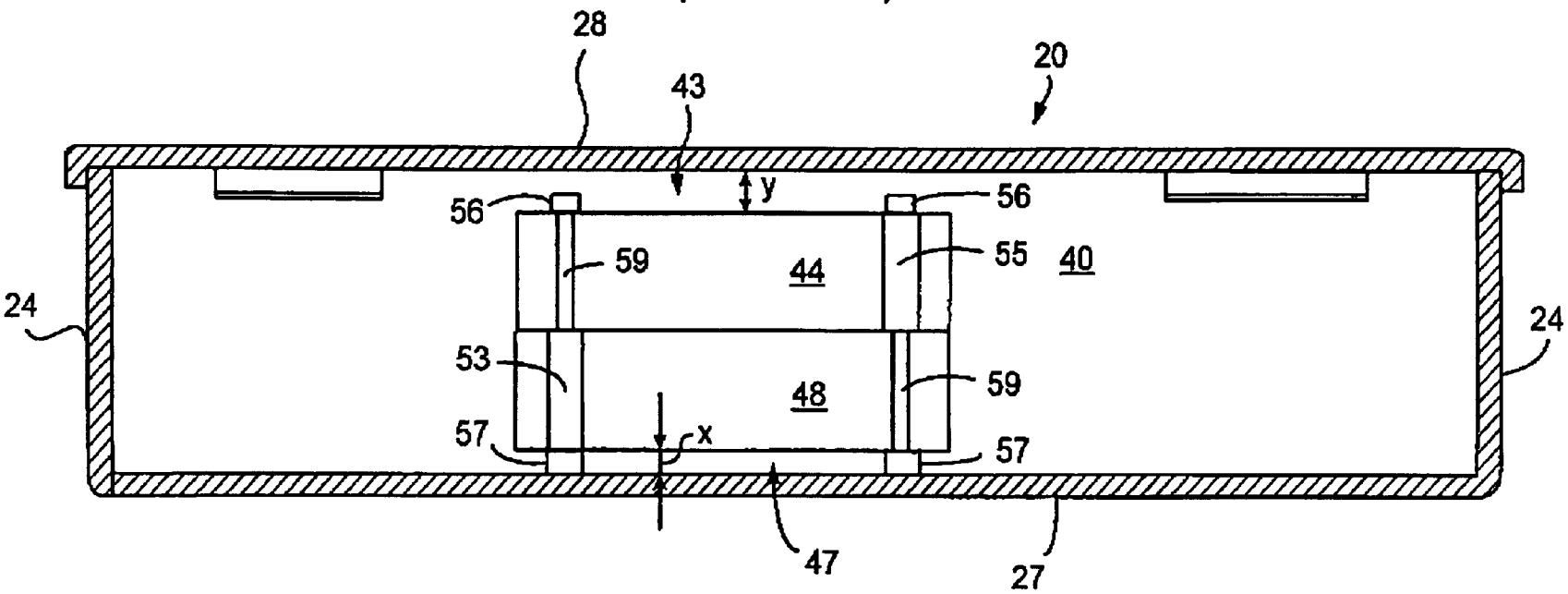
FIG. 3
(AMENDED)

LOW PROFILE COMPUTER CASE AND COMPUTER

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates to computer cases and computers and more specifically, the invention relates to a low profile computer case and computer.

2. Description of the Related Art

As computers become more ubiquitous in society, it becomes more desirable to reduce the size of computer systems. Currently, there is a clear trend toward more powerful and more compact computer systems. Accordingly, the consumed power per unit density, i.e. the power density, of the average computer has increased tremendously over the past several years. However, such an increase in power density runs into a limitation of heat dissipation. More specifically, the higher the power density, the more heat generated and the more difficult it is to dissipate the heat. Of course, heat adversely affects the operation of most microprocessor based components and other computer components. Accordingly, the desire to reduce the size and increase the power of computers is at odds with the need to maintain components at temperatures within desired operating ranges.

Essentially, there are two processes by which heat in a computer case is dissipated. The first process is "air exchange cooling" which consists of replacing heated air in the case with cooler air, e.g. ambient air. The second process is "forced cooling" in which air is moved across the surface of a specific component to raise the convective heat transfer coefficient for the surface of the component thereby cooling the component faster than if the component was in static air. Most computer cases incorporate both heat dissipation processes to some degree. Both processes require the movement of air.

It is well known to use fans to move air through computer cases to cool various components therein. Conventionally, such fans are placed in a front panel or a back panel of the computer case. However, the desire to reduce the size of computers requires that front and back panel space be utilized efficiently for accessible components such as communication ports and power connections on the back panel, and removable media and fixed media drives on the front panel. Accordingly, the use of a fan in the front or back panel wastes precious panel space. Fans have been placed in side panels to avoid this problem. However, popular rack mount systems, such as systems complying with Engineering Industries Association Standard 310-C (EIA-310-C), require that the computer case be mountable in a rack having sides that closely oppose side panels of the computer case. Accordingly, side panels of the racks may interfere with operation of fans mounted in side panels of computer cases and thus the practice of mounting fans in side panels of computer cases has limited application. Further, it is often desirable to mount sliding rails on the computer case to permit it to be slid out of the rack for maintenance and the like. Such rails interfere with fans mounted in side panels. The use of shelves to avoid the need for rails restricts vertical room.

It is also known to provide one or more fans in an interior of a computer case. U.S. Pat. No. 5,793,610 is exemplary of references disclosing such an arrangement. U.S. Pat. No. 5,793,610 discloses a computer case having a support member in an interior of the case. Plural cooling fans are mounted in the support member. If one of the fans fails, air tends to re-circulate back through the opening in which the failed fan is mounted and thus a complex louver arrangement is provided.

U.S. Pat. No. 5,168,424 discloses a data storage unit having a housing and internal plate 105. Two open loop dc centrifugal fans are mounted in plate 105 to draw air from an area housing memory devices to an area housing a power supply. U.S. Pat. No. 5,168,424 uses dual entry open loop centrifugal fans to adjust for a variable impedance to air flow caused by varying numbers of memory devices on the upstream side of the fans. The downstream side of the fans contains only a power supply over which air flows to vents in a front panel and thus does not present significant impedance to the system. The intake ports of the fans are positioned opposite data storage devices. The use of two centrifugal fans having intake ports opposite devices requires a large amount of space in the chassis and thus the arrangement disclosed in U.S. Pat. No. 5,168,424 is not suitable for a low profile computer chassis which includes a motherboard and other components that require additional space in the chassis.

EIA-310-C, the disclosure of which is incorporated herein by reference, specifies three different rack sizes and the sizes and tolerances of cases that can be disposed in the racks in an attempt to insure that computers and components from various venders will fit in the same racks. There are three standard panel widths, i.e. rack sizes, 19", 24", and 30", with 19" being the most common. The vertical or height dimension of the racks is divided into a plurality of individual units known as a "U". In particular, one U equals 44.45 mm+0.4 mm. The horizontal or width dimension of a case for a 19" rack is 482.6 mm+0.4 mm. Many computer servers or the like are housed in a 6U case, i.e. a case that fits in the width dimension of the 19" rack noted above and is 265.9 mm high (44.45 mm×6=266.7 mm−0.8 mm tolerance to permit sliding the case into and out of the rack as prescribed by EIA-310-C).

In accordance with the recent trend in miniaturization, servers have been reduced to 2U cases, i.e. cases 88.1 mm in height. However, conventional 2U servers have at most four media drives in the front panel because of the need for fans and to allow for adequate air flow for forced cooling. While components, such as media drives have gotten smaller, at any given time they are designed to fit into standard form factors, such as "half height" drives (approximately 1⅝" in height) and "low profile" drives (approximately 1" in height). Accordingly, case size and cooling considerations have limited the number of components, such as various media drives, that can be housed in a 2U case. Accordingly, the functionality and flexibility of conventional computers and computer components in 2U cases is limited.

It is important to utilize the limited width of EIA-320-C to its fullest extent also. Accordingly, conventional cases made to fit into standard EIA-310-C racks have side walls with a lip that extends across the top of the case to a small degree to allow a top panel to be screwed onto the lip from the top of the case thereby maximizing the width of the case. As noted above, many cases designed for rack mounting have slide out rails, i.e. drawer slides with rollers, that permit the case to be easily slid out of the rack and maintained in position for repair, maintenance and troubleshooting. The case including the slide out rails must fit within the standard rack width. Therefore, the use of rails, further limits the effective width of a case. Finally, an increased number of components results in an increased number of communication and power cables. If the cables are too bulky and not managed properly, they further restrict air flow and thus cooling. Cabling is one more consideration that puts increased component density at odds with cooling requirements.

SUMMARY OF THE INVENTION

It is an object of the invention to overcome the density/cooling limits of conventional standard rack mount computer cases.

It is another object of the invention to maximize the component space in a standard sized computer case.

It is another object of the invention to maximize the volume of airflow in a computer case.

It is another object of the invention to minimize the footprint of a cooling device in a computer case.

It is another object of the invention to use standard "off-the-shelf" components in a compact case.

A first aspect of the invention is a computer case of a standard height adapted to be mounted in a rack of a standard width, and configured to house plural computer components. The computer case comprises an enclosure defined by a front panel, a back panel, two side panels, a top panel, and a bottom panel. A partition is disposed in the enclosure and extends substantially from the bottom panel to the top panel to divide the enclosure into at least a first zone adapted to receive a mother board and a second zone adapted to receive at least one storage device. A centrifugal blower is coupled to an aperture in the partition to cause air flow between the first zone and the second zone.

A second aspect of the invention is a computer case of a standard height adapted to be mounted in a rack of a standard width, and configured to house plural computer components. The computer case comprises an enclosure defined by a front panel, a back panel, two side panels, a top panel, and a bottom panel. A partition is disposed in the enclosure and extends substantially from the bottom panel to the top panel to divide the enclosure into at least a first zone and a second zone. A first centrifugal blower is coupled to an aperture formed in the partition to cause air flow between the first zone and the second zone. An Inlet of the first centrifugal blower faces towards the top panel. A second centrifugal blower is also coupled to the aperture to cause air flow between the first zone and the second zone. An inlet of the second centrifugal blower faces towards the bottom panel and a top surface of the second centrifugal blower opposes a bottom surface of the first centrifugal blower.

BRIEF DESCRIPTION OF THE DRAWING

The invention will be described through a preferred embodiment and the attached drawing in which:

FIG. 3 is a sectional view taken along line 3—3 of FIG. 1 with some components removed for clarity;

DETAILED DESCRIPTION OF THE PREFERRED EMBODIMENT

Figure 1:
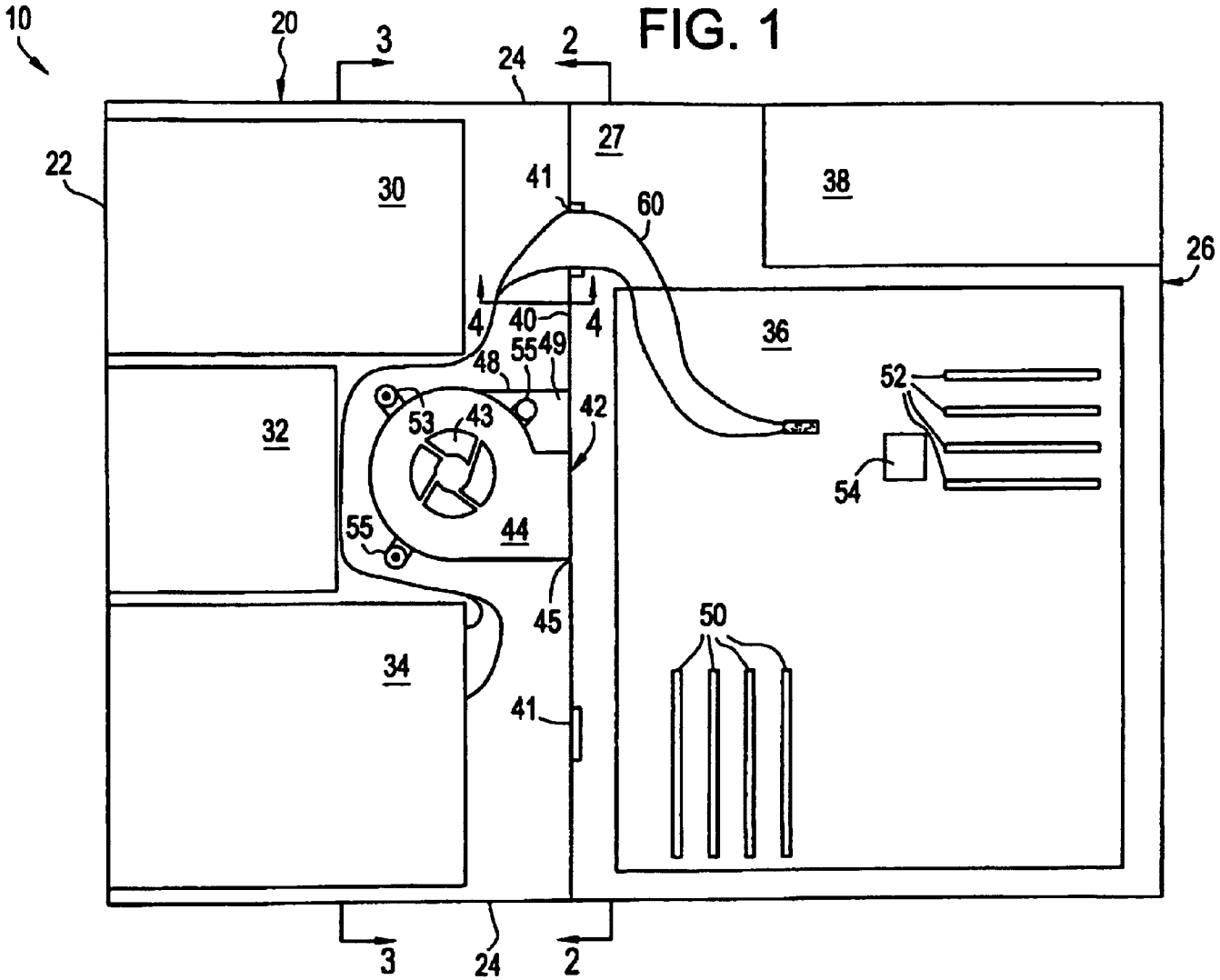
FIG. 1 is a top view of a computer in accordance with the preferred embodiment with a top panel of the case removed.
Figure 2:
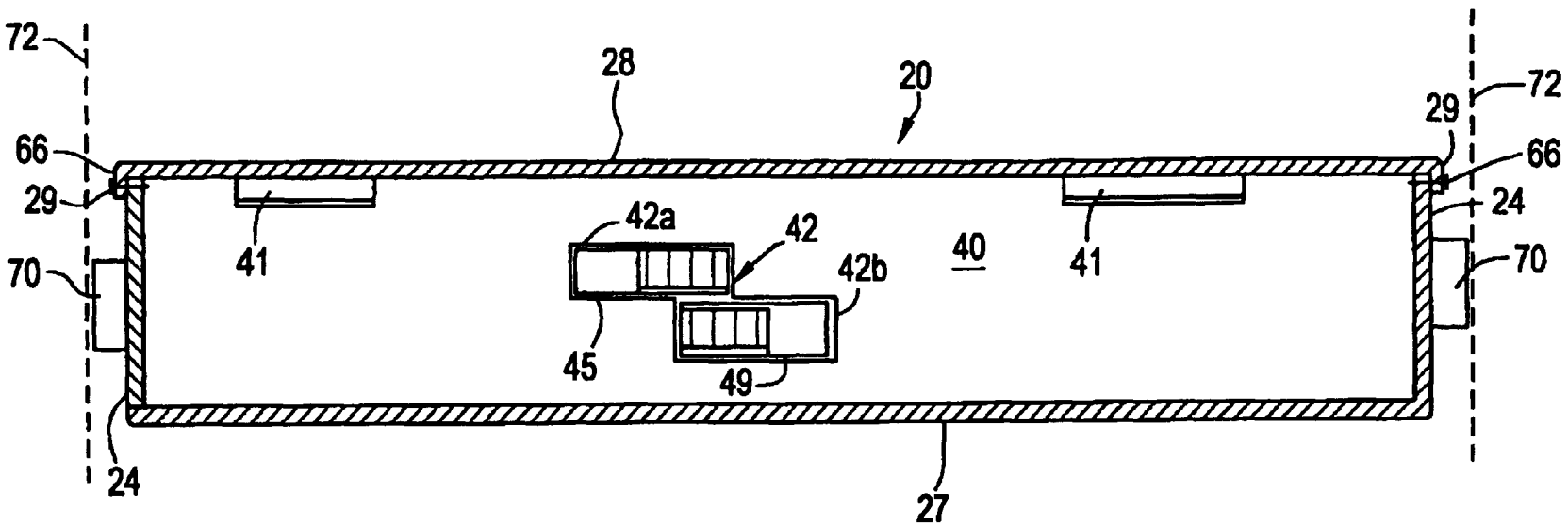
FIG. 2 is a sectional view taken along line 2—2 of FIG. 1.

FIGS. 1–5 illustrate a preferred embodiment of the invention. Computer 10 includes case 20 component bays 30, 32, and 34, mother board 36, and power supply 38. Case 20 of the preferred embodiment is a standard 19" rack mount, 24" deep, 2U case. In other words, case 20 defines a rectangular enclosure that is dimensioned to fit into a standard EIA-310-C 2U space in a 19" rack. As illustrated in FIGS. 1 and 2, case 20 is constructed of front panel 22, side panels 24, back panel 26 bottom panel 27, and top panel 28. *It should be noted that the location of these various panels are only described so as to more clearly explain the present invention in regards to the orientation of the case 20 as shown in the illustrated example of FIGS. 1–5. More generally, as can be seen from these figures, the rectangular enclosure is defined by a plurality of panel pairs, each panel pair comprising two panels positioned opposing one another. For instance, the front panel 22 and the back panel 26 comprises a panel pair, the bottom panel 27 and the top panel 28 comprises a panel pair, and the side panels 24 comprises a panel pair, the panels of the plurality of panel pairs being positioned opposite to one another. Of course, in other embodiments of the present invention, the case 20 may be oriented differently so that these locations no longer apply.* Note that, as illustrated in FIGS. 2 and 3, side panels 24 and bottom panel 27 can be formed of a single sheet with side panels 24 defined by right angle bends in the sheet. Partition 40 extends laterally between side panels 24 and vertically from bottom panel 27 to top panel 28 to divide case 20 into two zones. Aperture 42 is formed in partition 40. Blowers 44 and 48 are mounted in case 20 in the manner described below. Blowers 44 and 48 are centrifugal blowers, such as standard 96 mm blowers having mounting channels 53 (blower 48) and mounting channels 55 (blower 44) respectively. For example blowers 44 and 48 can each be a GAMMA 30™ blower sold by Nidec under the part number A34124-33. Manufactures of similar blowers having the same form factor include Delta, Adda, and Indec.

As illustrated in FIG. 2, aperture 42 comprises two rectangular portions 42a and 42b that abut one another. Each rectangular portion is sized to snugly receive an outlet port of one of blowers 44 and 48. In particular, outlet port 45 of blower 44 is disposed in rectangular portion 42a of aperture 42 and outlet port 49 (see FIGS. 2 and 3) of blower 48 is received in rectangular portion 42b of aperture 42. Accordingly, operation of blowers 44 and 48 creates a low pressure in a zone in front of partition 40 and a high pressure in a zone behind partition 40. Of course, this pressure differential results in air flow between the two zones through blowers 44 and 48. In particular, air flows in grills formed in front panel 22, and/or front panels of devices, into inlet 43 of blower 44 and inlet 47 (see FIG. 3) of blower 48, out of outlet ports 45 and 49 of blowers 44 and 48 respectively, and out of holes formed in back panel 26.

FIG. 3 illustrates the mounting configuration of blowers 44 and 48 in detail. Standoffs 57, such as PEMs™, are fixed to a surface of [bottom] panel 27 and blower 48 is disposed over standoffs 57. Specifically, one of mounting channels 53 of blower 48 abuts the top of one of [spacers] *standoffs* 57 and one of mounting channels 55 of blower 44 is aligned with the other of [spacers] *standoffs* 57. Bolts [54] *56* are passed through mounting channels 53 and 55 and tubular spacers 59 and threaded into a tapped hole formed in respective standoffs 57. Tightening bolts [54] *56* serves to fix blowers 44 and 48 in place with inlet 43 of blower 44 facing towards top panel 28 and inlet 47 of blower 48 facing towards [bottom] panel 27. Note that aperture 42 receives outlet ports 45 and 49 snugly to further support blowers 44 and 48.

Standoffs 57 are sized to provide a standoff distance x between bottom panel 27 and blower 48. Distance x defines an intake area that is roughly distance x multiplied by the circumference of inlet 47 of blower 48. The intake area preferably is substantially equal to or greater than the area of Inlet 47 (which is similar to inlet 43) of blower 48. Accordingly, blower 48 is not choked or hindered in performance in any way even though inlet 47 faces bottom panel 27. Similarly, a standoff distance of y is defined between top panel 28 and blower 44. Distance y defines an intake area that is roughly distance y multiplied by the circumference of inlet 43 of blower 44. This intake area preferably is substantially equal to or greater than the area of inlet 43 of blower 44 to avoid hindering the performance of blower 44.

In the preferred embodiment, case 20 is a 2U case and thus has an outer height dimension of 88.1 mm or roughly 3.47" at maximum. Assuming that top panel 28 and bottom panel 27 are each 90 mil (i.e. 0.090") thick, the inner height of case 20 between top panel 28 and bottom panel 27 is 3.29". Typical 96 mm blowers are 33 mm (1.3") thick. Therefore, two such blowers stacked on one another as illustrated take up at least 2.6" in the height dimension. Therefore, dimensions x and y can each be equal to about 0.345", ((3.29−2.6)/2=0.345). Applicant has found that x and y can be preferably in the range of 0.206"–0.370" inches inclusive, and most preferably in the range of 0.250" to 0.345", inclusive. Of course it is preferable to reduce the height of case 20 slightly below the maximum 2U specification to allow for torsion, and other variations. Therefore, x and y may be equal to about 0.250". Of course, when one of x and y is larger, the other becomes smaller.

The blower arrangement of the preferred embodiment permits two standard 96 mm blowers to be positioned in a 2U case while only presenting the footprint of one 96 mm blower. In other words the back to back stacked arrangement of blowers 44 and 48 minimizes their affective footprint by overlapping the footprints of blowers 44 and 48. Also, bays 30 and 34 are designed to accept components such as two standard width half height removable hard drives or three standard low profile hard drives. Half height hard drives have a length of roughly 6", a width of roughly 4", and a height of about 1⅝". Therefore, three such drives can be stacked one on another in bays 30 and 34 within the dimensions of a 2U case because there is no need to place fans in front panel 22.

Figure 5:
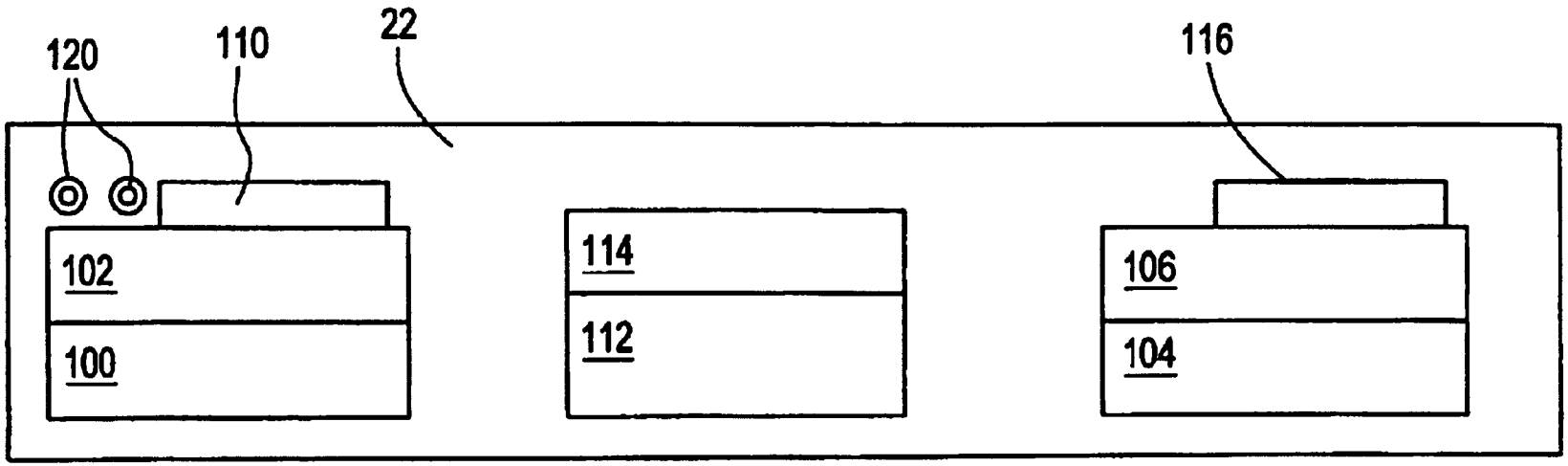
FIG. 5 is a front view of the front panel of the computer of FIG. 1.

As illustrated in FIGS. 1 and 5, bay 32 can accept DAT (digital audio tape) drive 112 that typically is about 1⅝" high and PC card chassis 114 that typically is about 1" high. Bays 30 and 34 can each contain two ruggedized removable half height hard drives. In particular hard drives 100 and 102 are disposed in bay 30 and hard drives 104 and 106 are disposed in bay 34. The depth of standard half height hard drives is accommodated by bays 30 and 34 as illustrated in FIG. 1. Bay 30 can also accommodate pilot lights or buttons 120 and low profile floppy drive 110. Further low profile CD ROM drive 116 can also be housed in bay 34. As illustrated in FIG. 1, this configuration leaves a void space in the zone between partition 40 and bay 32. Blowers 44 and 48 in the configuration described above fit into this void space while permitting adequate air flow around bays 30, 32, and 34. Also, because inlet 45 and 49 face upward and downward respectively, cables (such as ribbon cable 60) and other conductors can be directed around side portions of blowers 44 and 48 as illustrated in FIG. 1. Such cables can provide communications and power connections between the various components. Also, typical 96 mm blowers deliver about 25 $ft^3$/min of airflow. Accordingly, the preferred embodiment has 50 $ft^3$/min of airflow therethrough. Should one of blowers 44 and 48 fail, the other blower can adequately cool the various components for limited duty. A standard techometer feedback can be used to detect failure of a blower and to enunciation of an alarm or the like.

Motherboard 36 includes plural memory module slots 50 (for supporting SDRAM memory modules, EDO memory modules, SIMMS memory modules, DIMMS memory modules, or the like), expansion card slots 52 (PCI, ISA, EISA, AGP, or the like), processor 54 and various other components and connectors in a known manner. The well known "ATX form factor" motherboard is roughly 12"×13". Power supply 38 can be a standard 2U power supply. The dimensions of standard power supplies are about 4.5"×8.25". Accordingly, power supply 38 and motherboard 36 can be placed next to one another as shown within the width dimension of case 20 which is made to fit in a standard 19" rack.

Figure 4:
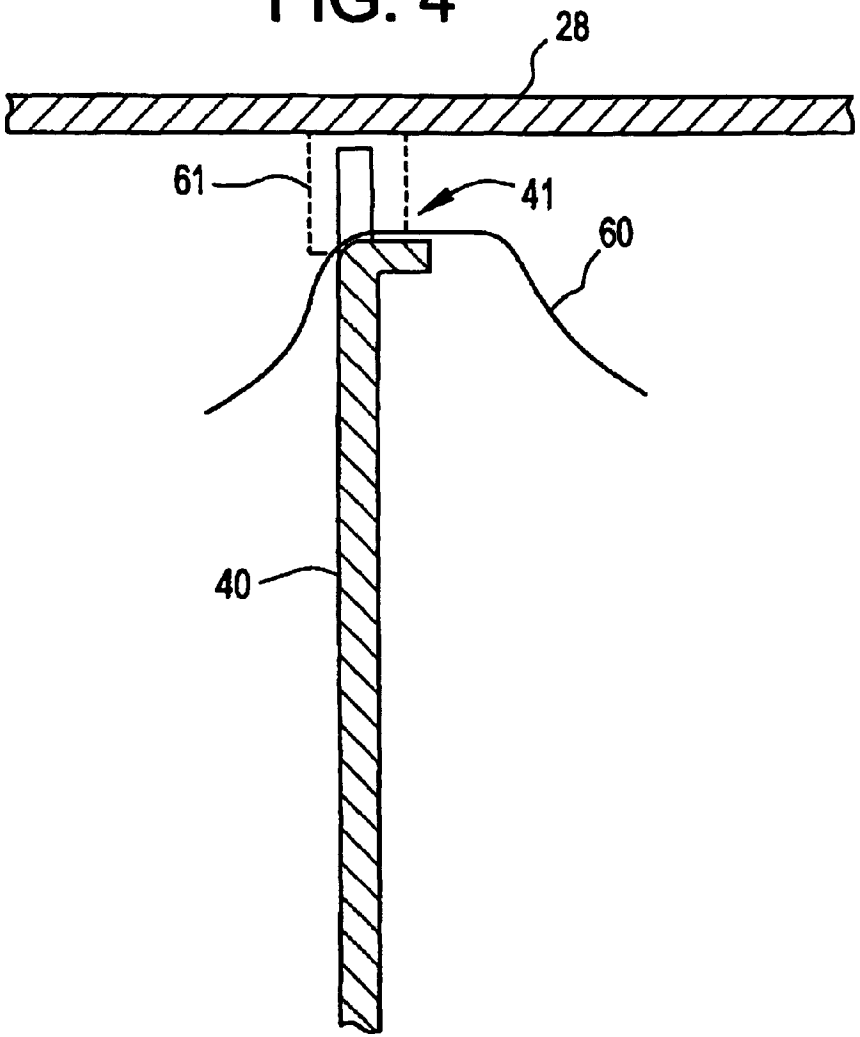
FIG. 4 is a partial sectional view taken along line 4—4 in FIG. 1.

As illustrated in FIGS. 1–3, partition 40 has bent portions formed on an upper edge thereof to define cable channels 41 extending through partition 40 to permit power cables, communication cables, and the like to pass through partition 40. For example, ribbon cable 60 from an IDE hard drive in bay 34 extends through either one of channels 41 to an IDE controller connector on motherboard 36. As illustrated in FIG. 4, each channel 41 is defined by bending a portion of the top edge of partition 40 at roughly a 90 degree angle. Of course, it may be necessary to form small cuts in partition 40 to define the width of channel 41. The width of channel 41 can be set to be slightly larger than the width of the largest ribbon cable to extend therethrough. It can be seen that the bent portion defines a smooth flat surface of channel 41 on which ribbon cable 60 can rest. Also, resilient member [62] *61* (illustrated with a dotted line for clarity), such as a gasket or other seal, can be disposed on a surface of top panel 28 in opposition to the top edge of partition 40 to seal channel 41 around ribbon cable 60. Resilient member [62] *61* can extend along the entire length of partition 40 or only in opposition to channels 41 or other portions of partition 40.

As illustrated in FIG. 2, top panel 28 includes wrap-around portions 29 that extend substantially orthogonally to main portions of top panel 28. Wrap-around portions 29 permit top panel 28 to be secured to side panels 24 by fasteners, such as screws 66, which extend through wrap-around portions 29 and side panels 24. This arrangement avoids screw heads on the main portion of top panel 28 to thereby reduce the clearance needed between top panel 28 and another unit disposed in a rack directly above top panel 28.

Accordingly, case 20 can have a slightly larger inner height dimension or top panel 28 can be slightly thicker to increase the mechanical strength and rigidity of case 20. Further, wrap-around portions 29 extend into a void space defined by slide out mounting rails 70 which are attached to side panels 22. Accordingly, wrap-around portions 29 do not add to the effective width dimension of case 20 which must fit into a standard sized rack. FIG. 2 illustrates slide out rails 70 on case 20. It can be seen that any portion of the heads of screws 66 that extends beyond wrap-around portions 29 will extend into a void space defined by rails 70 between side panels 24 and sides of rack 72 (shown with a dotted line) in which case 20 is mounted.

Figure 6:
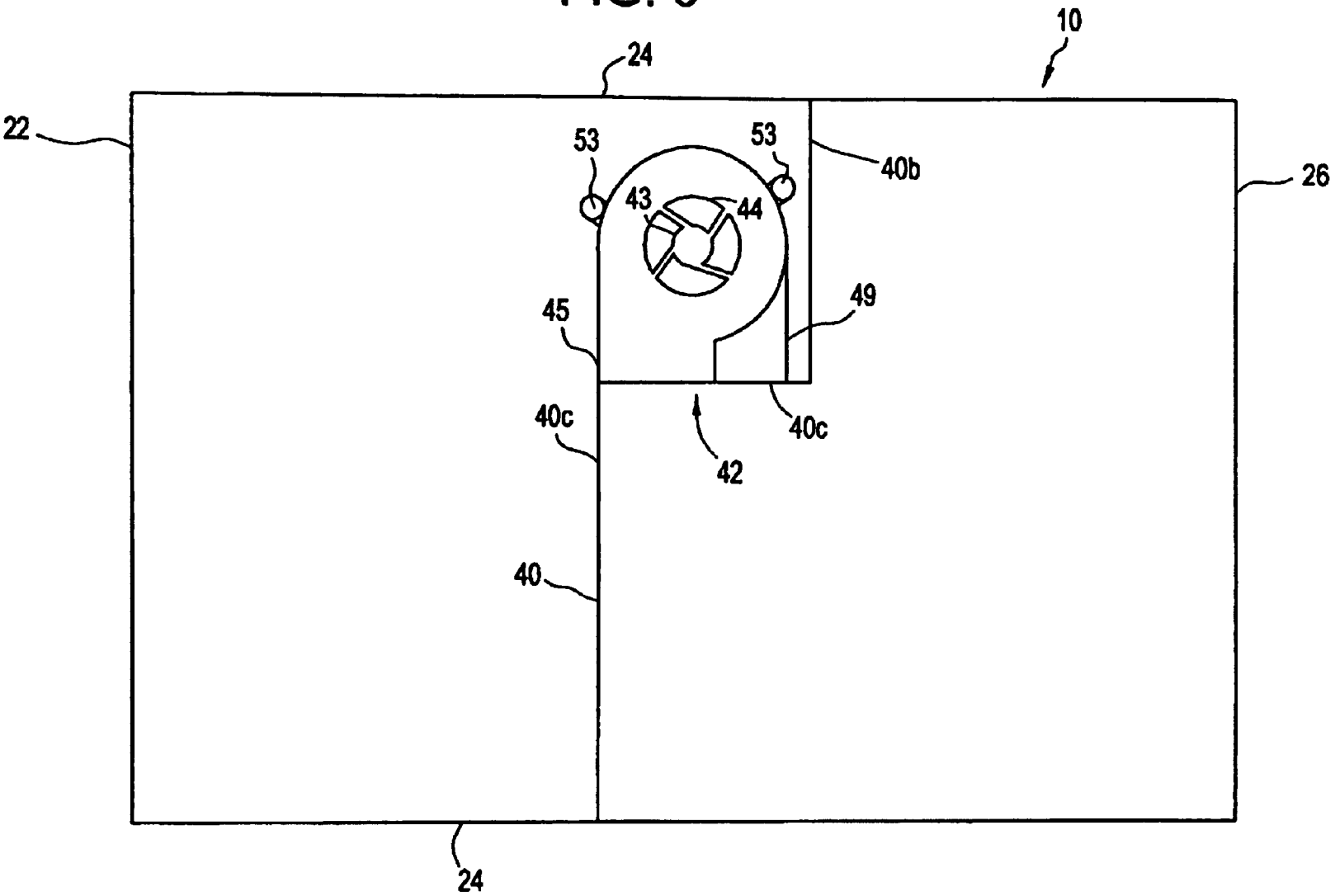
FIG. 6 illustrates a modified partition in accordance with the preferred embodiments.

FIG. 6 illustrates case 10 having modified partition 40 having offset portions 40a and 40b connected by connecting portion 40c. This arrangement allows different proportions of the zones for accommodating a mini ATX motherboard in a shallower case for example. Other elements for the case of FIG. 6 are similar to that of FIG. 1 and are unillustrated or labeled with like reference numerals.

The invention can have any components in any configuration. For example, various power supplies, drives, motherboards switches and memory devices can be used. The invention can be used in any size computer. The case can be rack mounted or free standing.

While the foregoing description includes many details and specificities, it is to be understood that these have been included for purposes of explanation only, and are not to be interpreted as limitations of the present invention. Many modifications to the embodiments described above can be made without departing from the spirit and scope of the invention, as is intended to be encompassed by the following claims and their legal equivalents.

What is claimed is:

1. A computer case of a standard height adapted to be mounted in a rack of a standard width, and configured to house plural computer components, said computer case comprising:

an enclosure defined by a front panel, a back panel, two side panels, a top panel, and a bottom panel;

a partition disposed in said enclosure and extending substantially from said bottom panel to said top panel to divide said enclosure into at least a first zone adapted to receive a motherboard and a second zone adapted to receive at least one memory device, an aperture being formed in said partition; and two centrifugal blowers coupled to said aperture *and provided back-to-back in a stacked arrangement with one another* to cause air flow between said first zone and said second zone, said two centrifugal blowers [comprise] *comprising* a first blower having an inlet facing said bottom panel and a second centrifugal blower having an inlet facing said top panel.

2. A computer case as recited in claim 1, wherein a first standoff dimension is defined between said inlet of said first centrifugal blower and said bottom panel, said first standoff dimension multiplied by the perimeter of the inlet of said first centrifugal blower defining an area that is substantially equal to or greater than an inlet area of said first centrifugal blower.

3. A computer case as recited in claim 2, wherein a second standoff dimension is defined between said inlet of said centrifugal second blower and said top panel, said second standoff dimension multiplied by the perimeter of said inlet of said second centrifugal blower defining an area that is substantially equal to or greater than an inlet area of said second centrifugal blower.

4. A computer case as recited in claim 3, wherein each of said side panels have sliding rails mounted on an outside surface thereof, and wherein said top panel comprises two wrap-around portions than extend over top portions of a respective one of said side panels, said wrap-around portions each extending into a respective void space defined by said sliding rails between said side panels and an outer dimension of said sliding rails.

5. A computer case as recited in claim 3, further comprising at least one bent portion formed in an edge of said partition to define a surface on said partition that is offset from the edge of said partition, a wire channel being defined on said surface.

6. A computer case as recited in claim 3, wherein said first centrifugal blower and said second centrifugal blower are standard 63 mm blowers.

7. A computer case as recited in claim 3, wherein said first centrifugal blower and said second centrifugal blower create a positive pressure in said first zone and a negative pressure in said second zone.

8. A computer case as recited in claim 3 wherein said first standoff dimension and said second standoff dimension are each in the range of 0.200–0.340 inches, inclusive.

9. A computer case as recited in claim 3 wherein said first standoff dimension and said second standoff dimension are each in the range of 0.220–0.342 inches, inclusive.

10. A computer case as recited in claim 1 further comprising three bays defined in said second zone and configured to hold components requiring access through said front panel, two of said bays extending substantially from said [from] front panel to said partition, the other of said bays extending from said front panel toward said partition to a lesser degree to define a void space between said partition and said other of said bays, said first centrifugal blower and said second centrifugal blower being disposed in said void space.

11. A computer case as recited in claim 1, wherein said partition comprises two offset portions and a connecting portion extending between the offset portions, said aperture being formed in said connecting portion.

12. A computer case of a standard height adapted to be mounted in a rack of a standard width, and configured to house plural computer components, said computer case comprising:

an enclosure defined by a front panel, a back panel, two side panels, a top panel, and a bottom panel;

a partition disposed in said enclosure and extending substantially from said bottom panel to said top panel to divide said enclosure into at least a first zone and a second zone, an aperture being formed in said partition;

a first centrifugal blower coupled to said aperture to cause air flow between said first zone and said second zone, an inlet *opening* of said first centrifugal blower facing towards said bottom panel *and a back surface of said first centrifugal blower directly opposite the inlet opening of the first centrifugal blower*;

a second centrifugal blower coupled to said aperture to cause air flow between said first zone and said second zone, [an inlet of said second centrifugal blower facing towards said top panel] *the second centrifugal blower comprising an inlet opening facing towards said top panel and a back surface directly opposite the inlet opening of the second centrifugal blower*, [a top] *and said back* surface of said second centrifugal blower [opposing a bottom] *directly opposes said back* surface of said first centrifugal blower.

13. A computer case as recited in claim 12, wherein a first standoff dimension is defined between said intake port of said first centrifugal blower and said bottom panel, said first standoff dimension multiplied by the perimeter of said inlet of said first centrifugal blower defining an area that is substantially equal to or greater than an inlet area of said first centrifugal blower.

14. A computer case as recited in claim 13, wherein a second standoff dimension is defined between said intake port of said second centrifugal blower and said top panel, said second standoff dimension multiplied by the perimeter of said second centrifugal blower defining an area that is substantially equal to or greater than an inlet area of said second centrifugal blower.

15. A computer case as recited in claim [12]*14,* wherein said first standoff dimension and said second standoff dimension are each in the range of 0.200–0.340 inches, inclusive.

16. A computer case as recited in claim [12]*14,* wherein said first standoff dimension and said second standoff dimension are each in the range of 0.220–0.342 inches, inclusive.

*17. The computer case of claim 12 wherein a distance between the top and bottom panels along a rotational axis of either the first centrifugal blower or the second centrifugal*

*blower is smaller than a distance between the front and back panels and a distance between the two side panels.*

*18. A computer case of a standard height adapted to be mounted in a rack of a standard width, and configured to house plural computer components, said computer case comprising:*

*an enclosure defined by a plurality of panel pairs, each panel pair comprising two panels positioned opposing one another;*

*a partition disposed in said enclosure and extending substantially between a first panel and a second panel of at least one of said plurality of panel pairs to divide said enclosure into at least a first zone adapted to receive a motherboard and a second zone adapted to receive at least one memory device, an aperture being formed in said partition; and*

*two centrifugal blowers coupled to said aperture to cause air flow between said first zone and said second zone, said two centrifugal blowers comprising:*

*a first blower having an inlet facing said first panel; and*

*a second blower and having an inlet facing said second panel and provided back-to-back in a stacked arrangement with the first blower.*

*19. A computer case as recited in claim 18, wherein a first standoff dimension is defined between said inlet of said first blower and said first panel, said first standoff dimension multiplied by the perimeter of the inlet of said first blower defining an area that is substantially equal to or greater than an inlet area of said first blower.*

*20. A computer case as recited in claim 19, wherein a second standoff dimension is defined between said inlet of said second blower and said second panel, said second standoff dimension multiplied by the perimeter of said inlet of said second blower defining an area that is substantially equal to or greater than an inlet area of said second blower.*

*21. A computer case as recited in claim 20, further comprising at least one bent portion formed in an edge of said partition to define a surface on said partition that is offset from the edge of said partition, a wire channel being defined on said surface.*

*22. A computer case as recited in claim 20, wherein said first blower and said second blower are standard 63 mm blowers.*

*23. A computer case as recited in claim 20, wherein said first blower and said second blower create a positive pressure in said first zone and a negative pressure in said second zone.*

*24. A computer case as recited in claim 20, wherein said first standoff dimension and said second standoff dimension are each in the range of 0.200–0.340 inches, inclusive.*

*25. A computer case as recited in claim 20, wherein said first standoff dimension and said second standoff dimension are each in the range of 0.220–0.342 inches, inclusive.*

*26. A computer case as recited in claim 18, wherein said partition comprises two offset portions and a connecting portion extending between the offset portions, said aperture being formed in said connecting portion.*

*27. A computer case as recited in claim 18, wherein said first panel is a bottom panel of said computer case, and said second panel is a top panel of said computer case.*

*28. A computer case of a standard height adapted to be mounted in a rack of a standard width, and configured to house plural computer components, said computer case comprising:*

*an enclosure defined by a plurality of panel pairs, each panel pair comprising two panels positioned opposing one another;*

*a partition disposed in said enclosure and extending substantially between a first panel and a second panel of at least one of said plurality of panel pairs to divide said enclosure into at least a first zone and a second zone, an aperture being formed in said partition;*

*a first centrifugal blower coupled to said aperture to cause air flow between said first zone and said second zone, said first centrifugal blower comprising a housing including an inlet opening facing towards said first panel and a outer surface directly opposite the first inlet opening;*

*a second centrifugal blower coupled to said aperture to cause air flow between said first zone and said second zone, said second centrifugal blower comprising a housing including an inlet having opening facing towards and said second panel, and an outer surface of the housing directly opposite the inlet opening of the second centrifugal blower.*

*29. A computer case as recited in claim 28, wherein a first standoff dimension is defined between said intake port of said first centrifugal blower and said first panel, said first standoff dimension multiplied by the perimeter of said inlet of said first centrifugal blower defining an area that is substantially equal to or greater than an inlet area of said first centrifugal blower.*

*30. A computer case as recited in claim 29, wherein a second standoff dimension is defined between said intake port of said second centrifugal blower and said second panel, said second standoff dimension multiplied by the perimeter of said second centrifugal blower defining an area that is substantially equal to or greater than an inlet area of said second centrifugal blower.*

*31. A computer case as recited in claim 30, wherein said first standoff dimension and said second standoff dimension are each in the range of 0.200–0.340 inches, inclusive.*

*32. A computer case as recited in claim 30, wherein said first standoff dimension and said second standoff dimension are each in the range of 0.220–0.342 inches, inclusive.*

*33. A computer case as recited in claim 28, wherein said first panel is a bottom panel of said computer case, and said second panel is a top panel of said computer case.*

*34. A blower arrangement adapted to be mounted in a computer case, said blower arrangement comprising:*

*a first blower having an inlet and an outlet port; and*

*a second blower directly secured to said first blower, said second blower having an inlet and an outlet port;*

*wherein said second blower is directly secured to said first blower in a manner that said inlet of said second blower is open toward a direction opposite to said inlet of said first blower, and said outlet port of said second blower is open toward a same direction as said outlet port of said first blower.*

*35. The blower arrangement of claim 34, wherein air is drawn into said inlets of said first blower and said second blower in opposite directions.*

*36. The blower arrangement of claim 35, wherein air is expelled from said outlets of said first blower and said second blower in a substantially same direction.*

*37. The blower arrangement of claim 36, wherein said inlet of said first blower is substantially perpendicular to said outlet port of said first blower, and said inlet of said second blower is substantially perpendicular to said outlet port of said second blower.*

*38. The blower arrangement of claim 34, wherein air is expelled from said outlets of said first blower and said second blower in a substantially same direction.*

*39. The blower arrangement of claim 34, wherein said inlet of said first blower is substantially perpendicular to said outlet port of said first blower.*

*40. The blower arrangement of claim 34, wherein said inlet of said second blower is substantially perpendicular to said outlet port of said second blower.*

*41. The blower arrangement of claim 34, wherein said outlet of said first blower and said outlet of said second blower are mounted to a partition in said computer case.*

*42. The blower arrangement of claim 34, wherein said second blower is secured to said first blower via fasteners.*

*43. A blower arrangement adapted to be mounted in a computer case, said blower arrangement comprising:*

*a first blower having an inlet and an outlet port, said inlet being substantially perpendicular to said outlet port; and*

*a second blower directly secured to said first blower, said second blower having an inlet and an outlet port, said inlet of said second blower being substantially perpendicular to said outlet port of said second blower;*

*wherein said inlet of said second blower is open toward a direction opposite to said inlet of said first blower so that air is drawn into said inlets of said first blower and said second blower in opposite directions, and said outlet port of said second blower is open toward a same direction as said outlet port of said first blower so that air is expelled from said outlets of said first blower and said second blower in a substantially same direction.*

*44. The blower arrangement of claim 43, wherein said outlet of said first blower and said outlet of said second blower are mounted to a partition in said computer case.*

*45. The computer case of claim 1, wherein a distance between the top and bottom panels along a rotational axis of either the first centrifugal blower or the second centrifugal blower is smaller than a distance between the front and back panels and a distance between the two side panels.*

* * * * *